(12) United States Patent
Seok et al.

(10) Patent No.: US 12,075,560 B2
(45) Date of Patent: Aug. 27, 2024

(54) MULTI-LEVEL PRINTED CIRCUIT BOARDS AND MEMORY MODULES INCLUDING THE SAME

(71) Applicant: Samsung Electronics Co., Ltd., Suwon-si (KR)

(72) Inventors: Jong-Hyun Seok, Seoul (KR); Yong-Jin Kim, Incheon (KR); Kyeongseon Park, Seoul (KR); Hwanwook Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 17/741,510

(22) Filed: May 11, 2022

(65) Prior Publication Data

US 2023/0065980 A1    Mar. 2, 2023

(30) Foreign Application Priority Data

Aug. 25, 2021   (KR) .......................... 10-2021-0112677

(51) Int. Cl.
*H05K 1/02*     (2006.01)
*H01P 3/08*     (2006.01)
(Continued)

(52) U.S. Cl.
CPC .............. *H05K 1/025* (2013.01); *H01P 3/08* (2013.01); *H01L 25/18* (2013.01); *H05K 1/117* (2013.01);
(Continued)

(58) Field of Classification Search
CPC ...... H05K 1/025; H05K 1/0253; H05K 1/117; H05K 1/18
See application file for complete search history.

(56) References Cited

U.S. PATENT DOCUMENTS

| 7,755,449 B2 | 7/2010 | Song |
| 9,131,603 B2 | 9/2015 | Xiao et al. |

(Continued)

FOREIGN PATENT DOCUMENTS

| JP | 2006351647 A | 12/2006 |
| JP | 2007150000 A | 6/2007 |

(Continued)

*Primary Examiner* — Jeremy C Norris
(74) *Attorney, Agent, or Firm* — Myers Bigel, P.A.

(57) ABSTRACT

A printed circuit board includes a first electrically conductive reference plane configured to distribute a first reference voltage applied thereto across a surface area of the first reference plane, and a second electrically conductive reference plane extending parallel to the first reference plane, and configured to distribute a second reference voltage applied thereto across a surface area of the second reference plane. A first layer is provided, which extends between the first reference plane and the second reference plane, and includes one or more first signal lines extending adjacent the first reference plane. The first layer is divided into: (i) a first region in which the one or more first signal lines are disposed, (ii) a second region containing an additional plane that is configured to receive a third voltage and has smaller surface area relative to the surface areas of the first and second reference planes, and (iii) a third region containing a dielectric layer. A second layer is provided, which extends between the first reference plane and the second reference plane, and includes one or more second signal lines extending adjacent the second reference plane. The second signal lines have linewidths that vary as a function of whether they are vertically aligned with the first region, the second region, or the third region.

20 Claims, 12 Drawing Sheets

(51) Int. Cl.
　　　*H01L 25/18*　　　(2023.01)
　　　*H05K 1/11*　　　(2006.01)
　　　*H05K 1/18*　　　(2006.01)

(52) U.S. Cl.
　　　CPC ..... *H05K 1/18* (2013.01); *H05K 2201/09227* (2013.01); *H05K 2201/09245* (2013.01); *H05K 2201/09336* (2013.01); *H05K 2201/09672* (2013.01); *H05K 2201/10159* (2013.01); *H05K 2201/10515* (2013.01); *H05K 2201/10522* (2013.01); *H05K 2201/10545* (2013.01)

(56) References Cited

U.S. PATENT DOCUMENTS

| | | |
|---|---|---|
| 9,166,550 B2 | 10/2015 | Devnani et al. |
| 10,707,548 B2 | 7/2020 | Kim et al. |
| 2009/0140823 A1 | 6/2009 | Lee et al. |
| 2013/0049880 A1 | 2/2013 | Oh et al. |
| 2014/0266490 A1 | 9/2014 | Xiao et al. |

FOREIGN PATENT DOCUMENTS

| | | |
|---|---|---|
| JP | 2016076540 A | 5/2016 |
| KR | 20030068238 A | 8/2003 |
| KR | 100822441 B1 | 4/2008 |

MULTI-LEVEL PRINTED CIRCUIT BOARDS AND MEMORY MODULES INCLUDING THE SAME

REFERENCE TO PRIORITY APPLICATION

This application claims priority under 35 U.S.C. § 119 to Korean Patent Application No. 10-2021-0112677, filed Aug. 25, 2021, the disclosure of which is hereby incorporated herein by reference.

BACKGROUND

Embodiments of the present disclosure described herein relate to memory modules and, more particularly, to printed circuit boards having multi-stripline structure and memory modules including the same.

A memory module in which semiconductor memory devices (e.g., memory chips) are mounted on a printed circuit board (PCB) is often used in various kinds of electronic devices. The printed circuit board may be configured to include a plurality of layers, which are separated from each other by a dielectric material having a power plane, a ground plane, and signal lines included therein.

The printed circuit board may have a stacked structure in which the power plane, the ground plane, and the signal lines are stacked, and a layer (hereinafter referred to as a "reference layer") including the power plane or the ground plane may provide a return path of signals. The layer used as the return path may be made of a plane for the purpose of providing an optimized return path and uniform impedance. A single stripline structure refers to a structure in which one layer including signal lines is stacked between two reference layers. A dual-stripline structure refers to a structure in which two layers including signal lines are stacked between two reference layers. The dual-stripline structure is advantageous in terms of miniaturization and cost reduction of a memory module compared to the single stripline structure, but may cause an undesirable impedance mismatching issue between adjacent layers.

SUMMARY

Embodiments of the present disclosure provide a printed circuit board of a multi-stripline structure that is capable of implementing uniform impedance, and a memory module including the same.

According to an embodiment, a printed circuit board includes a first reference plane that receives a first voltage, a second reference plane that is disposed parallel to the first reference plane and receives a second voltage, a first layer that is disposed between the first reference plane and the second reference plane so as to be adjacent to the first reference plane and includes one or more first signal lines, and a second layer that is disposed between the first reference plane and the second reference plane so as to be adjacent to the second reference plane and include one or more second signal lines. The first layer is divided into a first region in which the one or more first signal lines are disposed, a second region in which an additional plane whose area is smaller than an area of each of the first reference plane and the second reference plane and which is configured to receive a third voltage is disposed, and a third region in which a dielectric layer is disposed. A line width of each of the one or more second signal lines changes depending on at least one of the first region, the second region, and the third region.

According to another embodiment, a printed circuit board includes a first reference plane and a second reference plane disposed with a dielectric layer interposed therebetween and to which reference voltages are applied, a first layer disposed between the first reference plane and the second reference plane so as to be adjacent to the first reference plane and including a first signal line of a first line width and an additional plane configured to receive a ground voltage, and a second layer disposed between the first reference plane and the second reference plane so as to be adjacent to the second reference plane and including a plurality of signal lines. An area of the additional plane is smaller than an area of each of the first reference plane and the second reference plane, and the plurality of signal lines have different line widths depending on placement of the additional plane.

According to an embodiment, a memory module includes a printed circuit board including a structure in which a plurality of layers are stacked, a plurality of memory chips disposed on one surface or opposite surfaces of the printed circuit board along one or more columns, and a connector configured to electrically connect the memory chips with an external memory controller. The printed circuit board includes a first reference plane and a second reference plane disposed with a dielectric layer interposed therebetween and to which reference voltages are applied, a first layer disposed between the first reference plane and the second reference plane so as to be adjacent to the first reference plane and including a first signal line of a first line width and an additional plane configured to receive a ground voltage, and a second layer disposed between the first reference plane and the second reference plane so as to be adjacent to the second reference plane and including a plurality of signal lines. An area of the additional plane is smaller than an area of each of the first reference plane and the second reference plane, and the plurality of signal lines have different line widths depending on placement of the additional plane.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that an ordinary one in the art can easily implement the invention.

Figure 1:
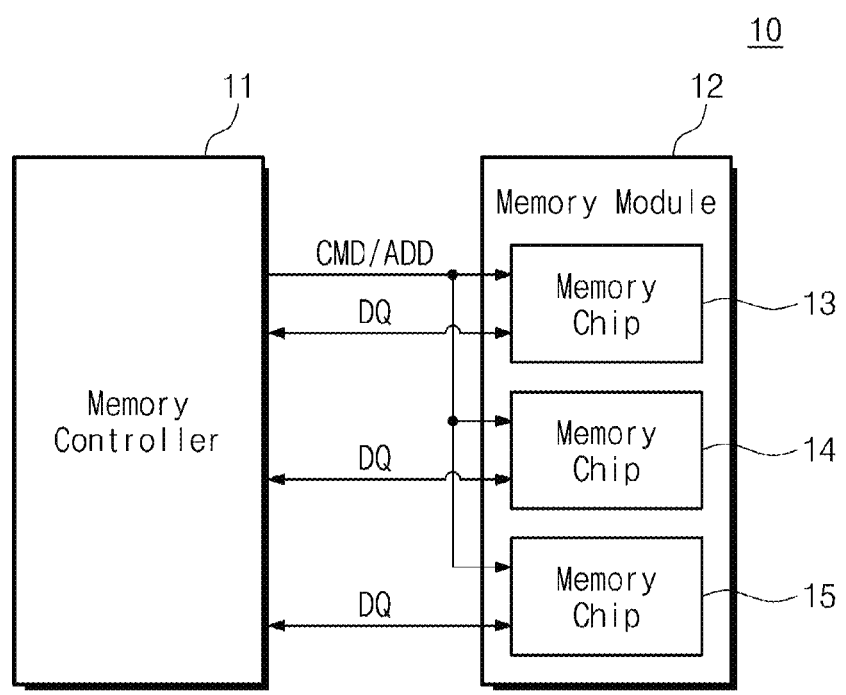
FIG. 1 is a block diagram illustrating a memory system according to an embodiment of the present disclosure.

FIG. 1 is a block diagram illustrating a memory system according to an embodiment of the present disclosure. Referring to FIG. 1, a memory system 10 may include a memory controller 11 and a memory module 12, which are communicatively coupled together to allow the transfer of control signals, commands and data, etc. therebetween. The memory controller 11 may transmit command and address signals CMD/ADD to the memory module 12 and may control the memory module 12. The memory controller 11 may exchange data with the memory module 12 by using a command and an address. For example, the memory controller 11 may exchange data signals DQ with the memory module 12. The memory controller 11 may also control the memory module 12 in response to a request of a processor supporting various applications, such as a server application, a personal computer (PC) application, and a mobile application. The memory controller 11 may be included within a host device having a processor therein, and may control the memory module 12 in response to request from the processor.

The memory module 12 may include first to third memory chips 13, 14, and 15. The first to third memory chips 13, 14, and 15 may receive a command CMD and an address ADD from the memory controller 11, and may exchange DQ signals with the memory controller 11 independently of each other. In detail, the first memory chip 13 may exchange DQ signals with the memory controller 11 in response to the command CMD and the address ADD. Similarly, each of the second and third memory chips 14 and 15 may independently exchange DQ signals with the memory controller 11.

Referring to FIG. 1, the transmission paths for the command and address signals CMD/ADD and the DQ signals may be provided between the memory controller 11 and the memory module 12. For example, the first to third memory chips 13, 14, and 15 may share the same transmission paths for the command and address signals CMD/ADD, but may utilize independent transmission paths for the DQ signals, as shown. According to an embodiment, before the memory controller 11 transmits a write command or a read command to the memory module 12, the memory controller 11 may independently set or update the operation modes of the first to third memory chips 13, 14, and 15. As will be understood by those skilled in the art, the number of memory chips of the memory module 12 is not limited to the example of FIG. 1. The memory module 12 may also be configured as a memory package.

Figure 2:
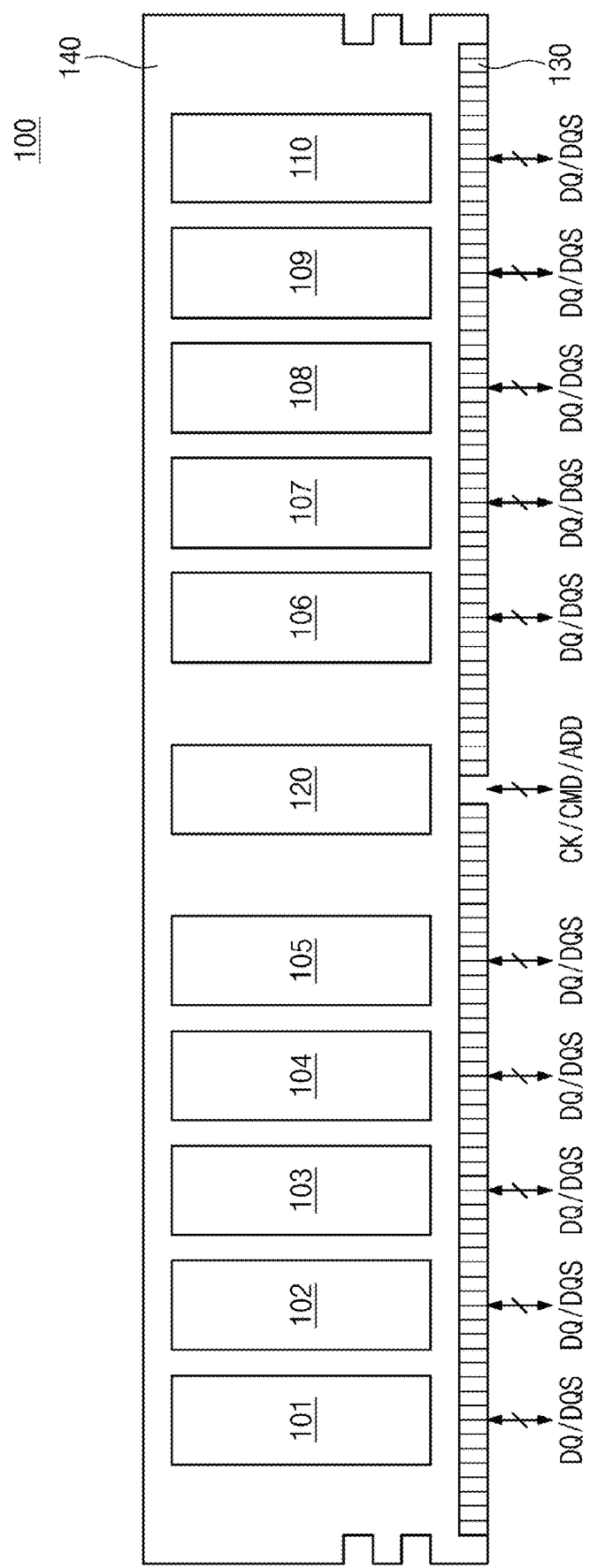
FIG. 2 is a diagram illustrating an example of a memory module of FIG. 1.

FIG. 2 is a diagram illustrating an example of a memory module of FIG. 1. Referring to FIGS. 1 and 2, a memory module 100 may include memory chips 101 to 110, a register clock driver (RCD) 120, a connector 130, and a printed circuit board 140. The memory module 100 may be a dual in-line memory module (DIMM) that complies with the JEDEC (Joint Electron Device Engineering Council) standard. For example, the memory module 100 may be a registered DIMM (RDIMM), a load reduced DIMM (LRDIMM), an unbuffered DIMM (UDIMM), a fully buffered DIMM (FB-DIMM), a small outline DIMM (SO-DIMM), or any other memory module (e.g., a single in-line memory module (SIMM)). In addition, the memory chips 101 to 110 may be various DRAM devices such as a double data rate synchronous dynamic random access memory (DDR SDRAM), DDR2 SDRAM, DDR3 SDRAM, DDR4 SDRAM, DDR5 SDRAM, a low power double data rate (LPDDR) SDRAM, LPDDR2 SDRAM, LPDDR3 SDRAM, LPDDR4 SDRAM, LPDDR4X SDRAM, LPDDR5 SDRAM, a graphics double data rate synchronous graphics random access memory (GDDR SGRAM), GDDR2 SGRAM, GDDR3 SGRAM, GDDR4 SGRAM, GDDR5 SGRAM, and GDDR6 SGRAM. Each of the memory chips 101 to 110 may be a memory device, in which multiple DRAM dies are stacked, such as a high bandwidth memory (HBM), HBM2, or HBM3. Each of the memory chips 101 to 110 may also be an SRAM, a NAND flash memory, a NOR flash memory, a RRAM, a FRAM, a PRAM, a TRAM, or an MRAM. The memory chips 101 to 110 may all be the same type or may include chips of different type from each other. Furthermore, the types of memory chips 101 to 110 are not limited to the above-described types, and any device capable of storing data may be included in the memory module 100. The number of memory chips 101 to 110 is only shown as an example, and the number of memory chips 101 to 110 may be determined depending on a memory capacity provided to a user and a capacity of each of the memory chips 101 to 110.

The memory chips 101 to 110 may be separated and disposed on the right and left sides of the register clock driver 120, as shown in FIG. 2. In an embodiment, the register clock driver 120 may be omitted. In this case, the memory chips 101 to 110 may be arranged on one surface of the printed circuit board 140 along one or more columns. The register clock driver 120 may receive clock, command, and address signals (CK/CMD/ADD) from an external device (e.g., a host or a memory controller). The register clock driver 120 may control the memory chips 101 to 110 based on the clock, command, and address signals. The register clock driver 120 may buffer the clock, command, and address signals.

The memory chips 101 to 110 and the register clock driver 120 may constitute a rank that is simultaneously accessed by a memory controller. The memory chips 101 to 110 in one rank may share control signals such as the clock, command, and address signals. In addition, the connector 130 may be electrically connected with the plurality of memory chips 101 to 110 and the register clock driver 120 through signal lines (not illustrated). Also, the connector 130 may be connected with a slot of the external device. That is, the connector 130 may perform a path role that allows the memory chips 101 to 110 and the register clock driver 120 to receive a DQ signal, a DQS signal, and the clock, command, and address signals (CK/CMD/ADD).

In an embodiment, the memory chips 101 to 110, the register clock driver 120, and the connector 130 may be disposed on one surface or opposite surfaces of the memory module 100. One surface or opposite surfaces of the memory module 100 may refer to one surface or opposite surfaces of the printed circuit board 140. Only one surface of the printed circuit board 140 is illustrated in FIG. 2, but the printed circuit board 140 may further include memory chips, a register clock driver, and a connector that are disposed on an opposite surface thereof. The memory chips and the register clock driver disposed on the opposite surface of the printed circuit board 140 may constitute another rank.

The printed circuit board 140 may have a stacked structure defined by multiple layers, including: (i) a plurality of power planes, (ii) a plurality of ground/reference planes, (iii)

and a plurality of signal lines (e.g., patterned metal traces). The stacked structure may include at least one of: a microstrip (MS), a single-stripline (SSL), a dual-stripline (DSL), and the like. The stacked structure of the printed circuit board 140 will now be described with reference to FIGS. 3A and 3B.

Figure 3A:
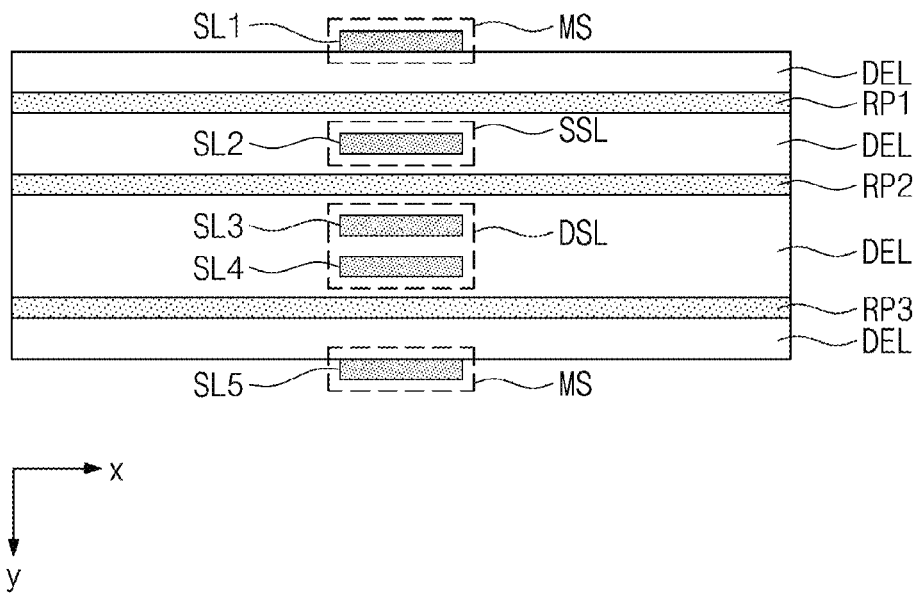
FIGS. 3A and 3B are cross-sectional views illustrating cross-sections of a printed circuit board of FIG. 2.
Figure 3B:
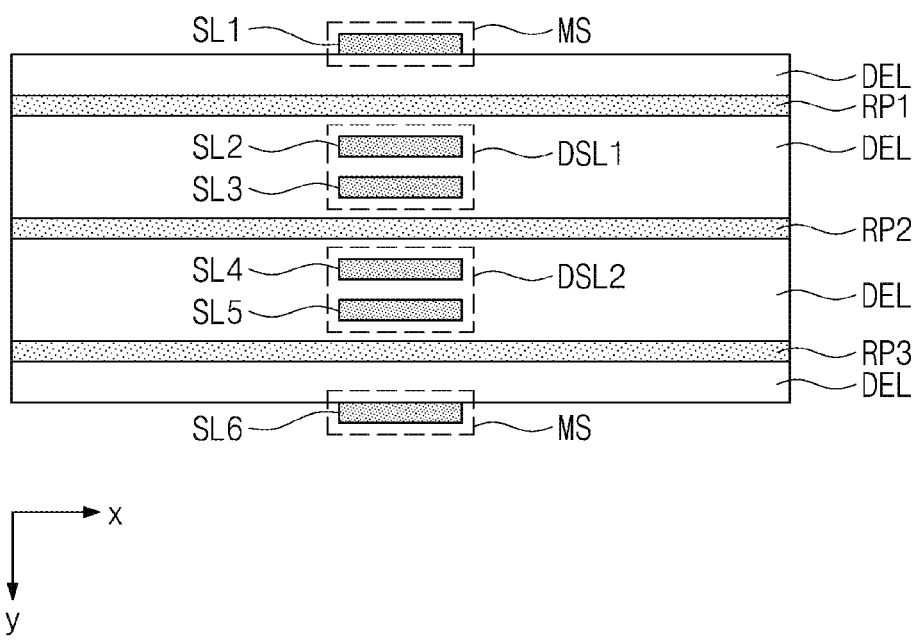

FIGS. 3A and 3B are cross-sectional views illustrating alternative possible cross-sections of the printed circuit board 140 of FIG. 2. For convenience of description, the stacked structures of the printed circuit board 140, which are illustrated by FIGS. 3A and 3B, are only provided as an example, and other stacked structures of the printed circuit board 140 are also feasible within the scope of the invention.

Referring to FIGS. 2 and 3A, a printed circuit board 140*a* may include first to third reference planes RP1, RP2, and RP3, first to fifth signal lines SL1, SL2, SL3, SL4, and SL5, and a dielectric layer DEL.

In an embodiment, the printed circuit board 140*a* may have a stacked structure including 8 layers. The first to third reference planes RP1, RP2, and RP3 and the first to fifth signal lines SL1, SL2, SL3, SL4, and SL5 may constitute the first to eighth layers. For example, the first layer may include the first signal line SL1, the second layer may include the first reference plane RP1, the third layer may include the second signal line SL2, the fourth layer may include the second reference plane RP2, the fifth layer may include the third signal line SL3, the sixth layer may include the fourth signal line SL4, the seventh layer may include the third reference plane RP3, and the eighth layer may include the fifth signal line SL5. A corresponding dielectric layer DEL may also be present between the various layers, and operate as an electrically insulating spacer layer.

The first layer and the eighth layer that are outer layers of the printed circuit board 140*a* may be formed in a microstrip (MS) structure. For example, the first signal line SL1 of the first layer may be stacked on the first reference plane RP1, with the dielectric layer DEL interposed therebetween, and the first signal line SL1 may contact ambient air. Likewise, the fifth signal line SL5 of the eighth layer may be stacked on the third reference plane RP3 with the dielectric layer DEL interposed therebetween, and the fifth signal line SL5 may contact ambient air.

The third layer that is an inner layer of the printed circuit board 140*a* may be formed in a single-stripline (SSL) structure. For example, the second signal line SL2 of the third layer may be stacked (e.g., sandwiched) between the first reference plane RP1 and the second reference plane RP2. The first reference plane RP1 and the second reference plane RP2 may be disposed in parallel. The second signal line SL2 may be parallel to the first reference plane RP1 and the second reference plane RP2 and may be disposed to be spaced from the first reference plane RP1 and the second reference plane RP2. The dielectric layer DEL may be formed in the remaining space between the first reference plane RP1 and the second reference plane RP2 other than a space corresponding to the second signal line SL2.

The fifth and sixth layers that are inner layers of the printed circuit board 140*a* may be formed in a dual-stripline (DSL) structure. For example, the third signal line SL3 of the fifth layer and the fourth signal line SL4 of the sixth layer may be stacked between the second reference plane RP2 and the third reference plane RP3. The second reference plane RP2 and the third reference plane RP3 may be disposed in parallel. The third signal line SL3 and the fourth signal line SL4 may be parallel to the second reference plane RP2 and the third reference plane RP3 and may be disposed to be spaced from the second reference plane RP2 and the third reference plane RP3. The third signal line SL3 may be disposed adjacent to the second reference plane RP2, and the fourth signal line SL4 may be disposed adjacent to the third reference plane RP3. The dielectric layer DEL may be formed in the remaining space between the second reference plane RP2 and the third reference plane RP3 other than a space corresponding to the second and fourth signal lines SL3 and SL4.

The second, fourth, and seventh layers, which are inner layers of the printed circuit board 140*a*, may be reference layers forming the first to third reference planes RP1, RP2, and RP3. A power supply voltage VDD, VPP, or VDDQ or a ground voltage VSS or VSSQ may be applied to each of the first to third reference planes RP1, RP2, and RP3, and the first to third reference planes RP1, RP2, and RP3 may provide return paths and uniform impedances of the first to fifth signal lines SL1, SL2, SL3, SL4, and SL5.

Referring to FIGS. 2 and 3B, a printed circuit board 140*b* may include the first to third reference planes RP1, RP2, and RP3, first to sixth signal lines SL1, SL2, SL3, SL4, SL5, and SL6, and the dielectric layer DEL. In an embodiment, the printed circuit board 140*b* may have a stacked structure including 9 layers. The first to third reference planes RP1, RP2, and RP3 and the first to sixth signal lines SL1, SL2, SL3, SL4, SL5, and SL6 may form first to ninth layers. For example, the first layer may include the first signal line SL1, the second layer include the first reference plane RP1, the third layer may include the second signal line SL2, the fourth layer may include the third signal line SL3, the fifth layer may include the second reference plane RP2, the sixth layer may include the fourth signal line SL4, the seventh layer may include the fifth signal line SL5, the eighth layer may include the third reference plane RP3, and the ninth layer may include the sixth signal line SL6. The dielectric layer DEL may be present between layers so as to be spaced from each other.

The first to third reference planes RP1, RP2, and RP3, the first and fourth to sixth signal lines SL1, SL4, SL5, and SL6, and the dielectric layer DEL of FIG. 3B are similar to the first to third reference planes RP1, RP2, and RP3, the first and third to fifth signal lines SL1, SL3, SL4, and SL5, and the dielectric layer DEL of FIG. 3A, and thus, additional description will be omitted to avoid redundancy. That is, the first, second, and fifth to ninth layers of FIG. 9B may correspond to the first, second, and fourth to eighth layers of FIG. 3A, respectively.

The third and fourth layers that are inner layers of the printed circuit board 140*b* may be formed in a first dual-stripline (DSL1) structure. For example, the second signal line SL2 of the third layer and the third signal line SL3 of the fourth layer may be stacked between the first reference plane RP1 and the second reference plane RP2. The first dual-stripline (DSL1) structure is similar to the dual-stripline (DSL) structure of FIG. 3A, and thus, additional description will be omitted to avoid redundancy.

The sixth and seventh layers that are inner layers of the printed circuit board 140*b* may be formed in a second dual-stripline (DSL2) structure. For example, the fourth signal line SL4 of the sixth layer and the fifth signal line SL5 of the seventh layer may be stacked between the second reference plane RP2 and the third reference plane RP3. The second dual-stripline (DSL2) structure is similar to the dual-stripline (DSL) structure of FIG. 3A, and thus, additional description will be omitted to avoid redundancy.

That is, referring to FIGS. 3A and 3B, the dual-stripline structure may refer to a structure in which two signal lines are embedded between two reference planes. In an embodiment, in the stacked structure of the printed circuit board 140, the dual-stripline structure may be formed without a limitation on a place except for outer layers of the printed circuit board 140.

Figure 4:
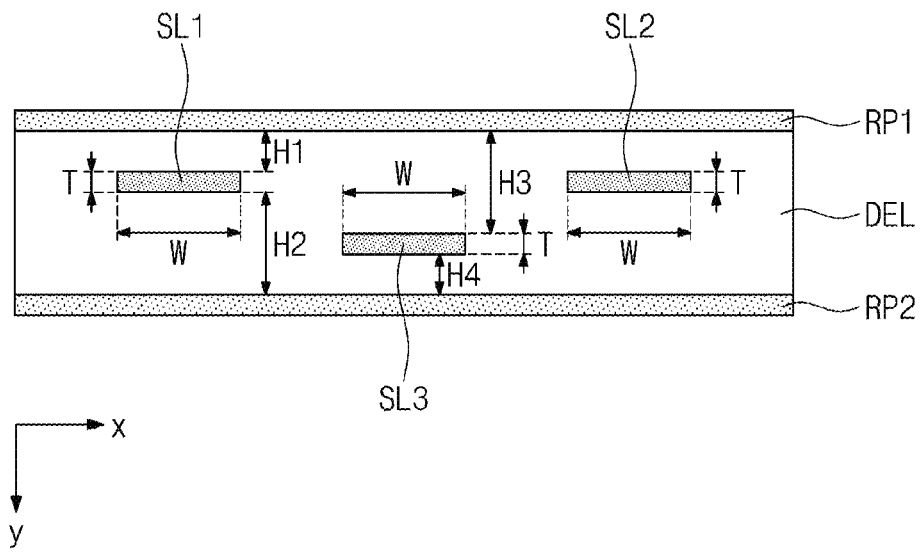
FIGS. 4 to 6 are detailed examples of a dual-stripline structure of a printed circuit board of FIG. 2.
Figure 5:
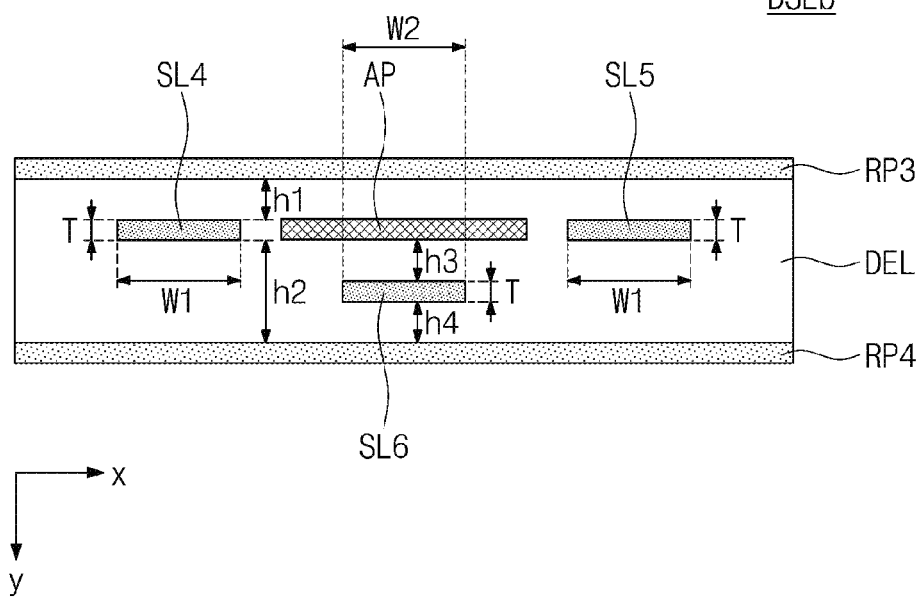
Figure 6:
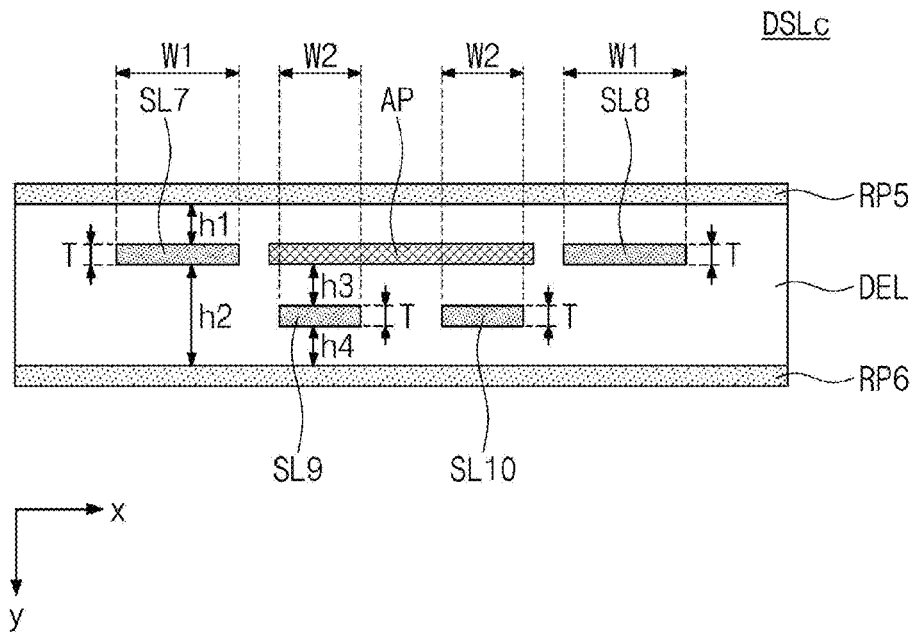

FIGS. 4 to 6 are detailed examples of a dual-stripline structure of a printed circuit board of FIG. 2. In particular, FIGS. 4 to 6 are cross-sectional views of the printed circuit board 140 illustrating first to third dual-stripline structures DSLa, DSLb, and DSLc. However, the dual-stripline structure is not limited to the first to third dual-stripline structures DSLa, DSLb, and DSLc and may be variously formed between two layers of reference planes.

Referring to FIGS. 2 and 4, the stacked structure of the printed circuit board 140 may include the first dual-stripline structure DSLa. The first dual-stripline structure DSLa may include a first reference plane RP1, a second reference plane RP2, a dielectric layer DEL, and first to third signal lines SL1, SL2, and SL3 embedded within the dielectric layer DEL.

The first reference plane RP1 and the second reference plane RP2 may be formed of a conductor and may supply the power supply voltages VDD, VPP, and VDDQ or the ground voltages VSS and VSSQ to the first to third signal lines SL1, SL2, and SL3. That is, each of the first reference plane RP1 and the second reference plane RP2 may form a power supply layer or a ground voltage layer.

The first reference plane RP1 may be disposed adjacent to the first and second signal lines SL1 and SL2 and may provide a return path of the first and second signal lines SL1 and SL2. The second reference plane RP2 may be disposed adjacent to the third signal line SL3 and may provide a return path of the third signal line SL3. The first reference plane RP1 and the second reference plane RP2 may include at least one material, whose conductivity is excellent, such as silver (Ag), palladium (Pd), aluminum (Al), nickel (Ni), titanium (Ti), gold (Au), copper (Cu), or platinum (Pt) or a mixture thereof.

That is, the dielectric layer DEL may be formed of a dielectric of a given dielectric constant, which is filled between the first reference plane RP1 and the second reference plane RP2. For example, the dielectric may include a thermosetting resin such as an epoxy resin, a thermoplastic resin such as polyimide, or a resin impregnated with a reinforcing material such as glass fiber or an inorganic filler therein, for example, prepreg, ABF (Ajinomoto Build-up Film), FR-4, BT (Bismaleimide Triazine) resin, or the like, but the present disclosure is not limited thereto.

The dielectric layer DEL may include two layers. The first to third signal lines SL1, SL2, and SL3 may form two layers. For example, the first layer may include the first and second signal lines SL1 and SL2, and may be disposed adjacent to the first reference plane RP1 in a vertical direction "y". For example, the second layer may include the third signal line SL3, and may be disposed adjacent to the second reference plane RP2 in the vertical direction "y". Each of the first layer and the second layer may include 1 or more signal lines and may perform a role of a signal transmission part. Herein, the vertical direction "y" may refer to a stacking direction.

Each of the first and second signal lines SL1 and SL2 may be spaced from the first reference plane RP1 as much as a first distance H1 in the vertical direction "y" and may be spaced from the second reference plane RP2 as much as a second distance H2 in the vertical direction "y". The third signal line SL3 may be spaced from the first reference plane RP1 as much as a third distance H3 in the vertical direction "y" and may be spaced from the second reference plane RP2 as much as a fourth distance H4 in the vertical direction "y".

The first distance H1 may be shorter than the third distance H3, and the second distance H2 may be longer than the fourth distance H4.

The first to third signal lines SL1, SL2, and SL3 may have the same line width "W" and the same thickness "T". The fact that the first to third signal lines SL1, SL2, and SL3 may have the same thickness "T" may mean that the thickness of the first layer is the same as the thickness of the second layer. The first to third signal lines SL1, SL2, and SL3 may not overlap each other in the vertical direction "y".

In the first dual-stripline structure DSLa, a characteristic impedance may be determined based on the line width "W" and the thickness "T" of the first to third signal lines SL1, SL2, and SL3, the first to fourth distances H1, H2, H3, and H4, and a dielectric constant of a dielectric forming the dielectric layer DEL. That is, in the first dual-stripline structure DSLa of FIG. 4, impedance matching may be performed by appropriately disposing the first to third signal lines SL1, SL2, and SL3 of the same line width "W" and the same thickness "T" such that the first to fourth distances H1, H2, H3, and H4 are adjusted.

Accordingly, the first dual-stripline structure DSLa may supply signals stably like a single-stripline structure, and an efficient stacked structure of the first dual-stripline structure DSLa may enable the reduction of manufacturing costs compared to the single-stripline structure. However, a space, that is, an empty space may be present between the first signal line SL1 and the second signal line SL2; for an even more efficient stacked structure, a conductor such as the first reference plane RP1 or the second reference plane RP2 may be added in the empty space.

Referring to FIGS. 2, 4, and 5, the stacked structure of the printed circuit board 140 may include the second dual-stripline structure DSLb. The second dual-stripline structure DSLb may include a third reference plane RP3, a fourth reference plane RP4, an additional plane AP, a dielectric layer DEL, and fourth to sixth signal lines SL4, SL5, and SL6. The third and fourth reference planes RP3 and RP4, the dielectric layer DEL, and the fourth and fifth signal lines SL4 and SL5 are similar to the first and second reference planes RP1 and RP2, the dielectric layer DEL, and the first and second signal lines SL1 and SL2 of FIG. 4, and thus, additional description will be omitted to avoid redundancy.

The second dual-stripline structure DSLb may include two layers between the third reference plane RP3 and the fourth reference plane RP4. For example, the first layer may include the fourth and fifth signal lines SL4 and SL5 and the additional plane AP, and may be disposed adjacent to the third reference plane RP3 in a vertical direction "y". For example, the second layer may include the sixth signal line SL6, and may be disposed adjacent to the fourth reference plane RP4 in the vertical direction "y". Each of the first layer and the second layer may include one or more signal lines and may perform a role of a signal transmission part.

The additional plane AP may be formed of the same conductor as the third reference plane RP3 or the fourth reference plane RP4 and may perform a role similar to that of the third reference plane RP3 or the fourth reference plane RP4. For example, the additional plane AP may be supplied with the power supply voltage VDD, VPP, or VDDQ or the ground voltage VSS or VSSQ and may provide a return path of the sixth signal line SL6. To this end, the sixth signal line SL6 may be disposed adjacent to the additional plane AP in the vertical direction "y".

The additional plane AP is illustrated in FIG. 5 as being interposed between the fourth signal line SL4 and the fifth signal line SL5, but a location of the additional plane AP is not limited thereto. The additional plane AP may be disposed in any space of the first layer except for a space in which the fourth and fifth signal lines SL4 and SL5 are present. The second dual-stripline structure DSLb may reinforce a power delivery network by disposing the additional plane AP in the first layer.

Each of the fourth and fifth signal lines SL4 and SL5 may be spaced from the third reference plane RP3 as much as a first distance h1 in the vertical direction "y" and may be spaced from the fourth reference plane RP4 as much as a second distance h2 in the vertical direction "y". The fourth and fifth signal lines SL4 and SL5 may have a first line width W1 and the thickness "T". The sixth signal line SL6 may be spaced from the additional plane AP as much as a third distance h3 in the vertical direction "y" and may be spaced from the fourth reference plane RP4 as much as a fourth distance h4 in the vertical direction "y". The sixth signal line SL6 may have a second line width W2 and the thickness "T". That is, the fourth to sixth signal lines SL4, SL5, and SL6 may have the same thickness "T".

The second line width W2 of the sixth signal line SL6 may be narrower than the first line width W1 of the fourth and fifth signal lines SL4 and SL5. This is for impedance matching. Compared to FIG. 4, the third distance h3 may become shorter due to the placement of the additional plane AP; in this case, impedance mismatching may occur due to the decrease in impedance.

For example, as a switch from DDR4 to DDR5 is made, that is, as a transfer speed of a memory increases, impedance mismatching may cause an issue in terms of the signal integrity. The impedance mismatching may generate a propagation delay or a reflected wave, that is, may cause an error of a transmission signal. Accordingly, in the second dual-stripline structure DSLb, a line width of a signal line (e.g., the sixth signal line SL6 of FIG. 6) of an adjacent layer, which is disposed at a location corresponding to a location of the additional plane AP, may be decreased relatively, thus minimizing the decrease in impedance and preventing the impedance mismatching.

Meanwhile, at least a portion of the signal line of the adjacent layer, which is disposed at the location corresponding to the location of the additional plane AP, may be disposed adjacent to the additional plane AP in the vertical direction "y". This will be more fully described with reference to FIGS. 10A and 10B.

Referring to FIGS. 2 and 4 to 6, the stacked structure of the printed circuit board 140 may include the third dual-stripline structure DSLc. The third dual-stripline structure DSLc may include a fifth reference plane RP5, a sixth reference plane RP6, an additional plane AP, a dielectric layer DEL, and seventh to tenth signal lines SL7, SL8, SL9, and SL10. The fifth and sixth reference planes RP5 and RP6, the additional plane AP, the dielectric layer DEL, and the seventh to ninth signal lines SL7, SL8, and SL9 are similar to the third and fourth reference planes RP3 and RP4, the additional plane AP, the dielectric layer DEL, and the fourth to sixth signal lines SL4, SL5, and SL6 of FIG. 5, and thus, additional description will be omitted to avoid redundancy.

The third dual-stripline structure DSLc may include two layers between the fifth reference plane RP5 and the sixth reference plane RP6. For example, the first layer may include the seventh and eighth signal lines SL7 and SL8 and the additional plane AP, and may be disposed adjacent to the fifth reference plane RP5 in the vertical direction "y". For example, the second layer may include the ninth and tenth signal lines SL9 and SL10, and may be disposed adjacent to the sixth reference plane RP6 in the vertical direction "y".

Each of the first layer and the second layer may include two or more signal lines and may perform a role of a signal transmission part.

Each of the seventh and eighth signal lines SL7 and SL8 may be spaced from the fifth reference plane RP5 as much as the first distance h1 in the vertical direction "y" and may be spaced from the sixth reference plane RP6 as much as the second distance h2 in the vertical direction "y". The seventh and eighth signal lines SL7 and SL8 may have the first line width W1 and the thickness "T".

In the second layer, a plurality of signal lines may be present under the additional plane AP. Like FIG. 6, the ninth and tenth signal lines SL9 and SL10 may be disposed adjacent to the additional plane AP in the vertical direction "y". In this case, each of the ninth and tenth signal lines SL9 and SL10 may have the second line width W2. The second line width W2 may be narrower than the first line width W1 of the seventh and eighth signal lines SL7 and SL8.

Each of the ninth and tenth signal lines SL9 and SL10 may be spaced from the additional plane AP as much as the third distance h3 in the vertical direction "y" and may be spaced from the sixth reference plane RP6 as much as the fourth distance h4 in the vertical direction "y". The ninth and tenth signal lines SL9 and SL10 may have the same thickness "T" as the seventh and eighth signal lines SL7 and SL8.

In other words, as described with reference to FIGS. 5 and 6, in the case where the additional plane AP is disposed in the first layer for reinforcement of the PDN, a distance between the additional plane AP and a signal line of the second layer may decrease, thereby causing some degree of impedance mismatching. Because the thickness of the printed circuit board 140 tends to become thinner, a way to match impedance by increasing a distance between the additional plane AP and the signal line of the second layer is problematic. Accordingly, the uniform impedance of the dual-stripline structure may be maintained by selectively decreasing only a line width of signal lines disposed at a location corresponding to a location of the additional plane AP.

Figure 7:
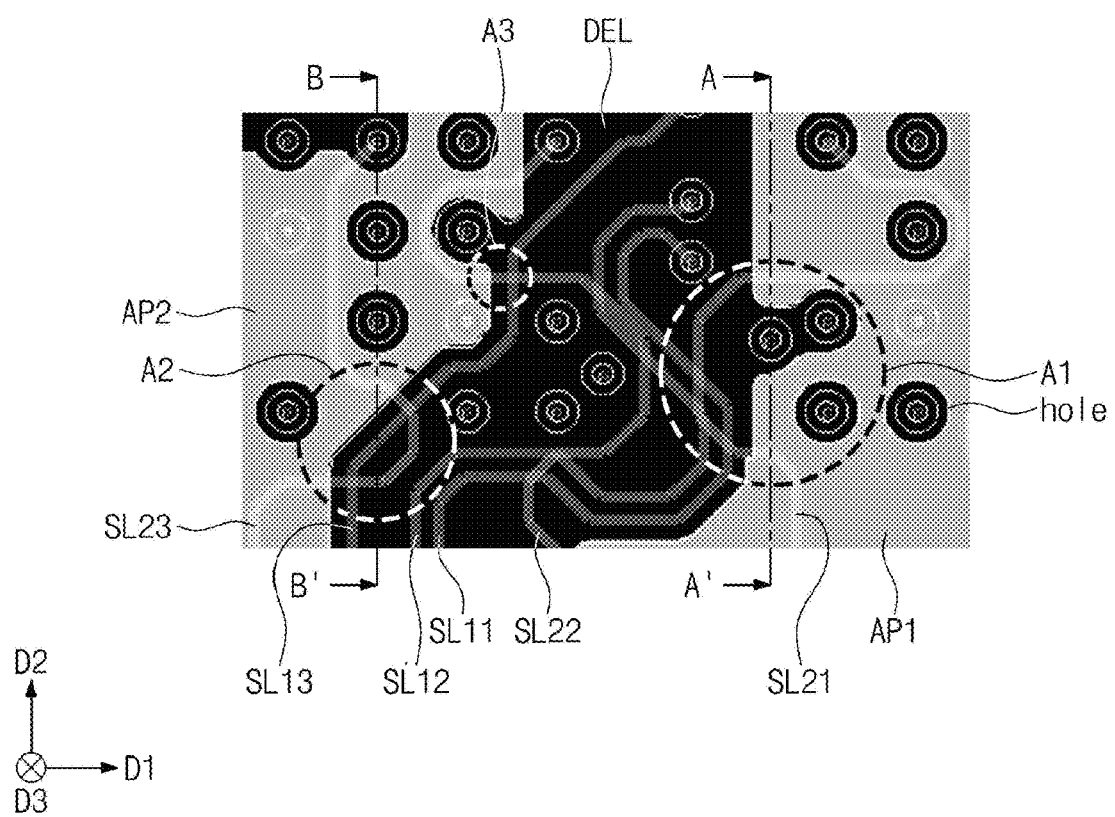
FIG. 7 is a plan view illustrating a portion of a printed circuit board according to an embodiment of the present disclosure.

FIG. 7 is a plan view illustrating a portion of a printed circuit board according to an embodiment of the present disclosure. A printed circuit board 200 may include the dual-stripline structure, and the plan view of FIG. 7 shows a first layer and a second layer performing a role of a signal transmission part in the dual-stripline structure. The first layer and the second layer may be adjacent to each other in a vertical direction. In an embodiment, FIG. 7 may be understood as showing an upper end (or upper surface) of the first layer and an upper end (or upper surface) of the second layer together.

Referring to FIGS. 5 and 7, the printed circuit board 200 may include first signal lines SL11, SL12, and SL13, second signal lines SL21, SL22, and SL23, first and second additional planes AP1 and AP2, a dielectric layer DEL, and a plurality of holes. The first layer may include the first signal lines SL11, SL12, and SL13 and the first and second additional planes AP1 and AP2. The second layer may include the second signal lines SL21, SL22, and SL23.

Each of the first signal lines SL11, SL12, and SL13 corresponds to the fourth signal line SL4 or the fifth signal line SL5 of FIG. 5, and thus, additional description will be omitted to avoid redundancy. That is, the first signal lines SL11, SL12, and SL13 may be formed to have the same line width and the same thickness and may be configured to efficiently transfer signals.

Each of the first signal lines SL11, SL12, and SL13 may extend in any direction in a two-dimensional plane defined by a first direction D1 and a second direction D2. A length of each of the first signal lines SL11, SL12, and SL13 may be defined in a direction in which each of the first signal lines SL11, SL12, and SL13 extends. A line width of each of the first signal lines SL11, SL12, and SL13 may be defined in a direction perpendicular to the direction in which each of the first signal lines SL11, SL12, and SL13 extends. An example in which the number of first signal lines SL11, SL12, and SL13 is three is illustrated in FIG. 7, but the present disclosure is not limited thereto.

Each of the second signal lines SL21, SL22, and SL23 corresponds to the sixth signal line SL6 of FIG. 5, and thus, additional description will be omitted to avoid redundancy. That is, each of the second signal lines SL21, SL22, and SL23 may be formed to have a line width the same as or narrower than that of the first signal lines SL11, SL12, and SL13. The second signal lines SL21, SL22, and SL23 may be formed to have the same thickness and may be configured to transfer signals.

Each of the second signal lines SL21, SL22, and SL23 may extend in any direction in the two-dimensional plane defined by the first direction D1 and the second direction D2. A length of each of the second signal lines SL21, SL22, and SL23 may be defined in a direction in which each of the second signal lines SL21, SL22, and SL23 extends. A line width of each of the second signal lines SL21, SL22, and SL23 may be defined in a direction perpendicular to the direction in which each of the second signal lines SL21, SL22, and SL23 extends. An example in which the number of second signal lines SL21, SL22, and SL23 is three is illustrated in FIG. 7, but the present disclosure is not limited thereto.

Each of the first and second additional planes AP1 and AP2 corresponds to the additional plane AP of FIG. 5, and thus, additional description will be omitted to avoid redundancy. That is, each of the first and second additional planes AP1 and AP2 may be disposed in the remaining space of the first layer except for a space occupied by the first signal lines SL11, SL12, and SL13 and may reinforce the PDN of the printed circuit board 200. An example in which the number of first and second additional planes AP1 and AP2 is two is illustrated in FIG. 7, but the present disclosure is not limited thereto.

The plurality of holes may include a via hole or a through-hole penetrating at least one or more layers. To this end, the plurality of holes may be extended in a stacking direction. Below, in the specification, the stacking direction is defined as a third direction D3. Connecting lines may be disposed in the plurality of holes for the purpose of electrically connecting conductive layers disposed in different layers. Inner surfaces of the plurality of holes may be covered with copper foil for the purpose of transferring electrical signals.

The dielectric layer DEL may correspond to the remaining space other than a space including the first signal lines SL11, SL12, and SL13, the second signal lines SL21, SL22, and SL23, the first and second additional planes AP1 and AP2, and the plurality of holes. The dielectric layer DEL corresponds to the dielectric layer DEL of FIG. 5, and thus, additional description will be omitted to avoid redundancy.

The first signal lines SL11, SL12, and SL13, the second signal lines SL21, SL22, and SL23, and the first and second additional planes AP1 and AP2 may be formed in the printed circuit board 200 in various stacked structures. FIGS. 8 to 10B illustrate embodiments of stacked structures in which at least two or more of the first signal lines SL11, SL12, and SL13, the second signal lines SL21, SL22, and SL23, and the first and second additional planes AP1 and AP2 are formed.

Figure 8:
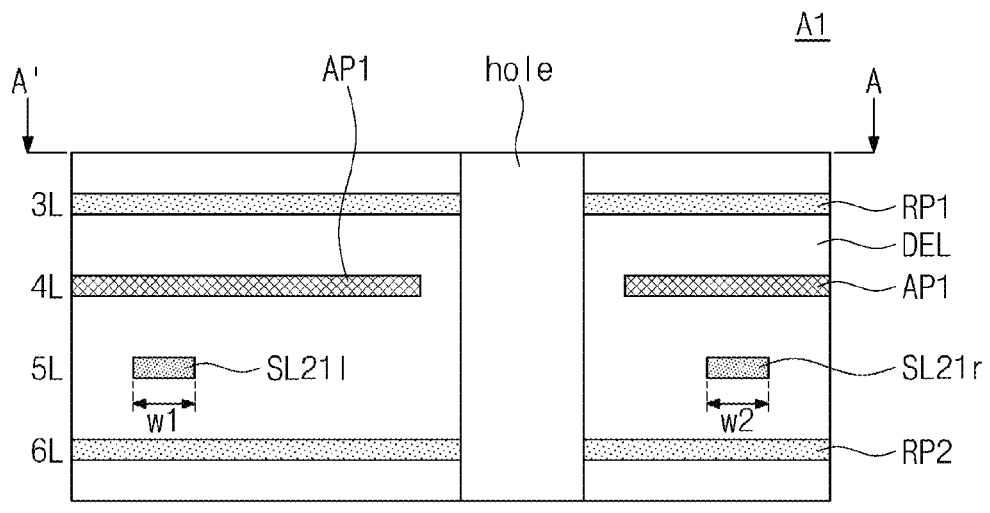
FIG. 8 is a cross-sectional view of a first portion of a printed circuit board, taken along line A-A' of FIG. 7.
Figure 8:
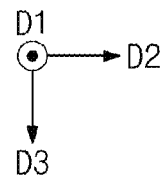

FIG. 8 is a cross-sectional view of a first portion taken along line A-A' of FIG. 7. Referring to FIGS. 7 and 8, a first portion A1 of the printed circuit board 200 may include a first reference plane RP1, a second reference plane RP2, the first additional plane AP1, second signal lines SL21l ("left") and SL21r ("right"), a dielectric layer DEL, and a hole.

Each of the first reference plane RP1 and the second reference plane RP2 may form a power supply layer or a ground voltage layer. A first layer and a second layer may be disposed between the first reference plane RP1 and the second reference plane RP2. According to an embodiment, the first reference plane RP1 may form a third layer 3L, and the second reference plane RP2 may form a sixth layer 6L. As such, the first layer may form a fourth layer 4L, and the second layer may form a fifth layer 5L.

The first layer may include the first additional plane AP1, and the second layer may include the second signal lines SL21l and SL21r. The hole may be formed to penetrate the first reference plane RP1, the second reference plane RP2, the first layer, and the second layer. The dielectric layer DEL may be formed to fill a space between the first reference plane RP1 and the second reference plane RP2.

Each of the second signal lines SL21l and SL21r may extend in the first direction D1. According to an embodiment, the second signal lines SL21l and SL21r may be connected to each other on another cross-section to form the second signal line SL21 of FIG. 7. The second signal line SL21l placed on the left of drawing may have a first line width w1, and the second signal line SL21r placed on the right of drawing may have a second line width w2.

Both the second signal line SL21l placed on the left and the second signal line SL21r placed on the right may be disposed under the first additional plane AP1. That is, both the second signal line SL21l placed on the left and the second signal line SL21r placed on the right may be disposed adjacent to the first additional plane AP1 in the vertical direction. Accordingly, the first line width w1 may be the same as the second line width w2, and may be narrower than line widths of the first signal lines SL11, SL12, and SL13 of FIG. 7.

Figure 9:
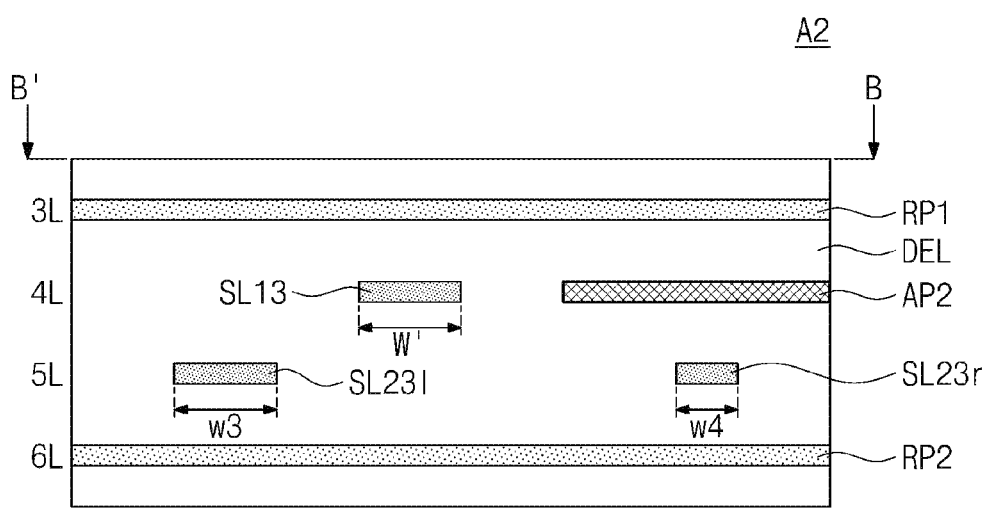
FIG. 9 is a cross-sectional view of a second portion of a printed circuit board, taken along line B-B' of FIG. 7.
Figure 9:
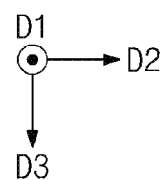

FIG. 9 is a cross-sectional view of a second portion taken along line B-B' of FIG. 7. Referring to FIGS. 7 to 9, a second portion A2 of the printed circuit board 200 may include the first reference plane RP1, the second reference plane RP2, the second additional plane AP2, the first signal line SL13, second signal lines SL23l and SL23r, and the dielectric layer DEL. The first reference plane RP1 and the second reference plane RP2 are similar to the first reference plane RP1 and the second reference plane RP2 of FIG. 8, and thus, additional description will be omitted to avoid redundancy.

A first layer and a second layer may be formed between the first reference plane RP1 and the second reference plane RP2. The first layer may include the second additional plane AP2 and the first signal line SL13, and the second layer may include the second signal lines SL23l ("left") and SL23r ("right"). The dielectric layer DEL may be formed to fill a space between the first reference plane RP1 and the second reference plane RP2.

The first signal line SL13 may correspond to the first signal line SL13 of FIG. 7. The first signal line SL13 may have a uniform line width "W", may extend in a specific direction between the first direction D1 and the second direction D2. Accordingly, in the cross-sectional view of FIG. 9, the line width of the first signal line SL13 is shown as a specific line width W wider than the uniform line width "w".

Each of the second signal lines SL23l and SL23r may extend in the first direction D1. According to an embodiment, the second signal lines SL23l and SL23r may be connected to each other on another cross-section to form the second signal line SL23 of FIG. 7. The second signal line SL23l placed on the left of drawing may have a third line width w3, and the second signal line SL23r placed on the right of drawing may have a fourth line width w4.

The second signal line SL23r placed on the right may be disposed under the second additional plane AP2. That is, the second signal line SL23r placed on the right may be disposed adjacent to the second additional plane AP2 in the vertical direction. Accordingly, the fourth line width w4 may be narrower than the line widths of the first signal lines SL11, SL12, and SL13 of FIG. 7.

In contrast, the dielectric layer DEL may be disposed in a layer adjacent to the second signal line SL23l placed on the left. Accordingly, the third line width w3 may be the same as the line widths of the first signal lines SL11, SL12, and SL13 of FIG. 7. That is, the third line width w3 may be wider than the fourth line width w4. In other words, a line width of one second signal line SL23 may vary depending on a configuration of a layer adjacent to the second signal line SL23.

Figure 10A:
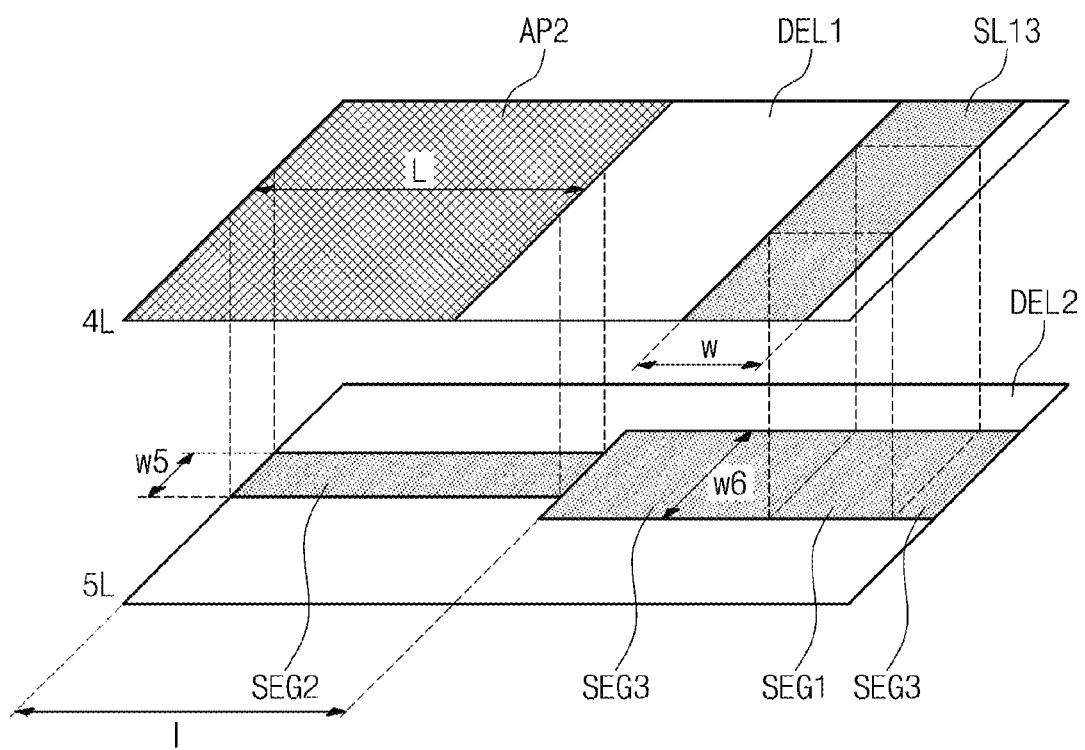
FIGS. 10A and 10B are perspective views illustrating a third portion of the printed circuit board of FIG. 7.
Figure 10B:
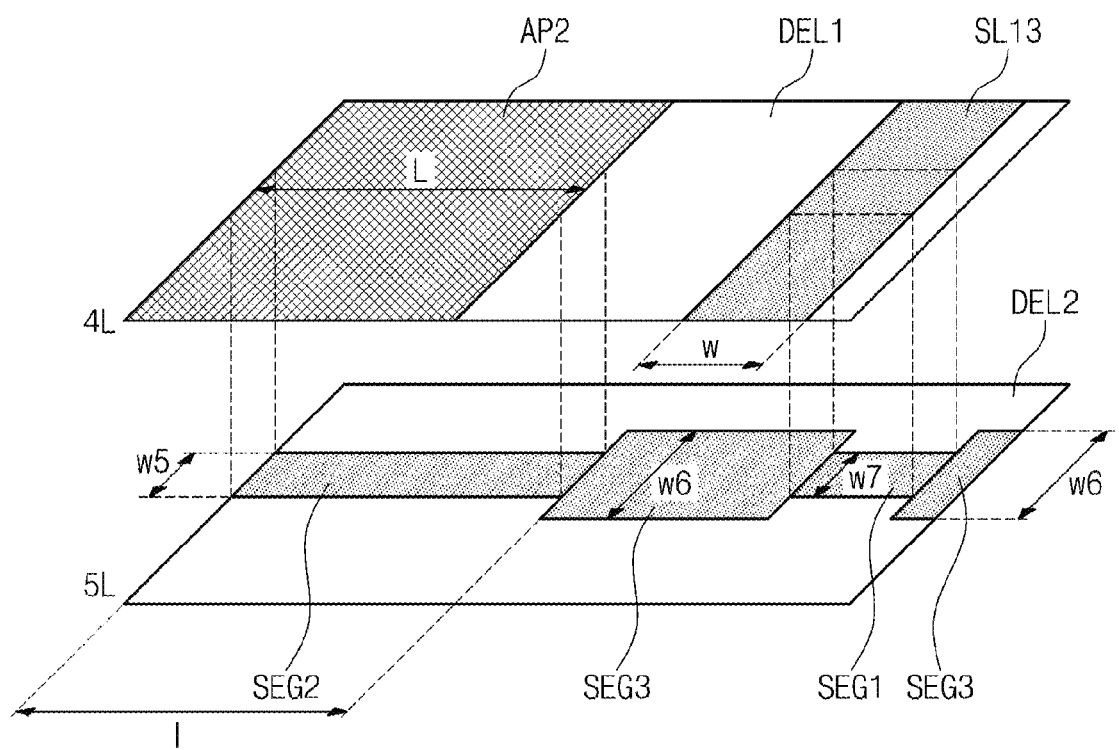

FIGS. 10A and 10B are perspective views illustrating a third portion of FIG. 7. Referring to FIGS. 7 to 10A, a third portion A3-1 of the printed circuit board 200 may include the second additional plane AP2, the first signal line SL13, the second signal line SL22, and dielectric layers DEL1 and DEL2. Although not illustrated, the third portion A3-1 may further include the first reference plane RP1 and the second reference plane RP2 for the dual-stripline structure.

The second additional plane AP2, the first signal line SL13, and the first dielectric layer DEL1 may form a first layer. The second additional plane AP2 may have a first length "L" in the first direction D1. The first signal line SL13 may have a uniform line width "w", and may extend in the second direction D2. The first dielectric layer DEL1 may be formed to fill a space of the first layer except for a space corresponding to the second additional plane AP2 and the first signal line SL13. The first dielectric layer DEL1 may correspond to the dielectric layer DEL of FIG. 7.

In an embodiment, the first layer may be divided into a first region in which the first signal line SL13 is disposed, a second region in which the second additional plane AP2 is disposed, and a third region in which the first dielectric layer DEL1 is disposed. A line width of the second signal line SL22 may vary depending on the relationship with the first region, the second region, and the third region.

The second signal line SL22 and the second dielectric layer DEL2 may form a second layer. The second signal line SL22 may extend in the first direction D1. The second signal line SL22 may include first to third segments SEG1, SEG2, and SEG3 depending on a configuration of the first layer.

The first segment SEG1 may correspond to the first signal line SL13 of the first layer. In an embodiment, the first segment SEG1 may overlap the first region in the third direction D3. In detail, the first segment SEG1 may be disposed under the first signal line SL13 or the first region. That is, the first segment SEG1 may be disposed adjacent to the first signal line SL13 in the vertical direction. According to an embodiment, signal lines different from the first signal lines SL13, that is, the first signal lines SL11 and SL12 may be disposed over the first segment SEG1.

The second segment SEG2 may correspond to the second additional plane AP2 of the first layer. In an embodiment, the second segment SEG2 may overlap the second region in the third direction D3. In detail, the second segment SEG2 may be disposed under the second additional plane AP2 or the second region. That is, the second segment SEG2 may be disposed adjacent to the second additional plane AP2 in the vertical direction. According to an embodiment, the first additional plane AP1 may be disposed over the second segment SEG2.

The second segment SEG2 may have a second length "l" and a fifth line width w5. The second length "l" may be the same as the first length "L" or may have a difference with the first length "L" within a specific length. According to an embodiment, the specific length may be 0.2 μm, but the present disclosure is not limited thereto. The fifth line width w5 may be narrower than the line width "W" of the first signal line SL13.

The third segment SEG3 may correspond to the first dielectric DEL1 of the first layer. In an embodiment, the third segment SEG3 may overlap the third region in the third direction D3. In detail, the third segment SEG3 may be disposed under the first dielectric layer DEL1 or the third region. That is, the third segment SEG3 may be disposed adjacent to the first dielectric layer DEL1 in the vertical direction. In other words, the second additional plane AP2 and the first signal line SL13 may not be disposed in a layer adjacent to the third segment SEG3.

The first segment SEG1 and the third segment SEG3 may have the same line width. For example, each of the first segment SEG1 and the third segment SEG3 may have a sixth line width w6. The sixth line width w6 may be the same as the line width "W" of the first signal line SL13. That is, the sixth line width w6 may be wider than the fifth line width w5.

According to an embodiment, the first segment SEG1 and the third segment SEG3 may have different line widths. Referring to FIGS. 7 to 10B, a third portion A3-2 of the printed circuit board 200 may include the second additional plane AP2, the first signal line SL13, the second signal line SL22, and the dielectric layers DEL1 and DEL2. The second additional plane AP2, the first signal line SL13, the second segment SEG2, the third segment SEG3, and the dielectric layers DEL1 and DEL2 of FIG. 10B are similar to the second additional plane AP2, the first signal line SL13, the second segment SEG2, the third segment SEG3, and the dielectric layers DEL1 and DEL2 of FIG. 10A, and thus, additional description will be omitted to avoid redundancy.

Referring to FIG. 10B, the first segment SEG1 may correspond to the first signal line SL13 or the first region and may have a seventh line width w7. The second segment SEG2 may correspond to the second additional plane AP2 or the second region and may have the fifth line width w5. The third segment SEG3 may correspond to the first dielectric layer DEL1 or the third region and may have the sixth line width w6. The seventh line width w7 may be narrower than the line width "W" of the first signal line SL13. That is, the seventh line width w7 may be narrower than the sixth line width w6. The seventh line width w7 may be the same as or different from the fifth line width w5.

Figure 11:
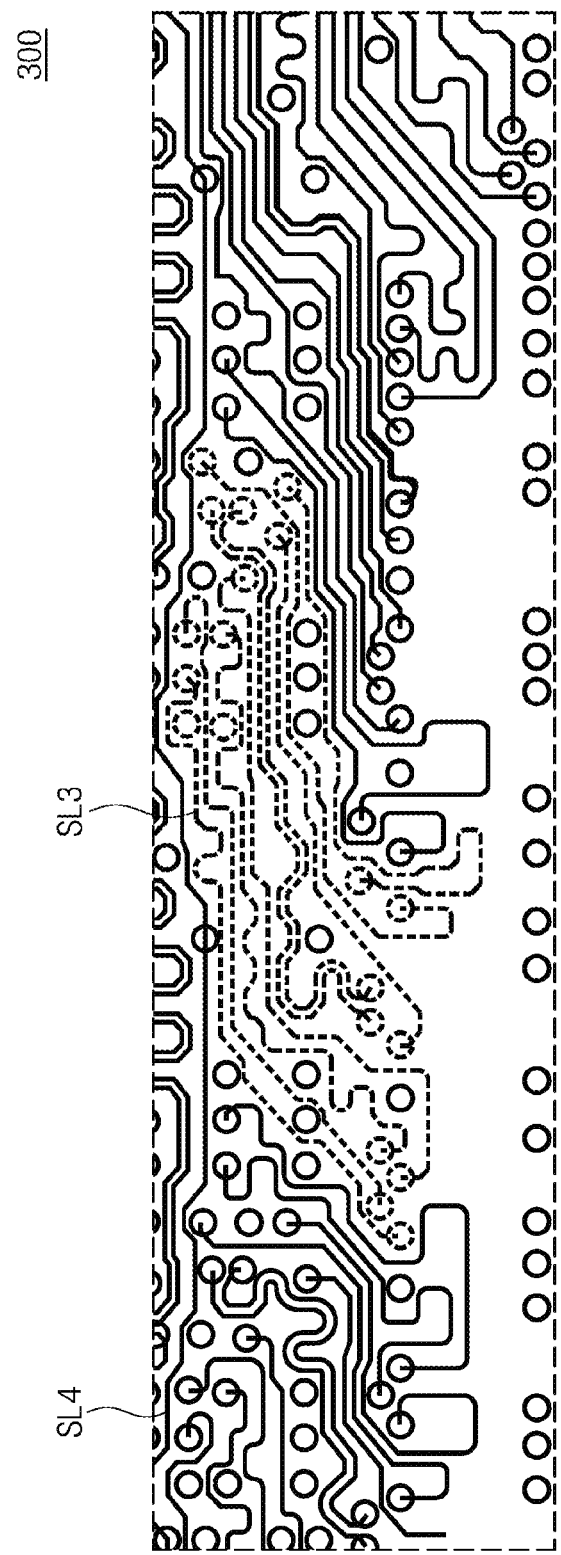
FIG. 11 is a plan view illustrating a portion of a printed circuit board according to an embodiment of the present disclosure.

FIG. 11 is a plan view illustrating a portion of a printed circuit board according to an embodiment of the present disclosure. A printed circuit board 300 may include the dual-stripline structure, and the plan view of FIG. 11 shows a second layer disposed under a first layer from among the first layer and the second layer performing a role of a signal transmission part in the dual-stripline structure. The first layer and the second layer may be adjacent to each other in a vertical direction.

The second layer may include the third signal lines SL3 marked by a dotted line and the fourth signal lines SL4 marked by a solid line. A line width of the third signal lines SL3 may be narrower than a line width of the fourth signal lines SL4. For example, the line width of the third signal lines SL3 may be 3 mil (i.e., 0.003 inches), and the line width of the fourth signal lines SL4 may be 4 mil (i.e., 0.004 inches).

The first layer may be disposed adjacent to the second layer in the vertical direction. Although not illustrated, it may be understood from FIG. 11 that the first layer may include an additional plane. In detail, the additional plane may be disposed at a location of the first layer, which corresponds to the third signal lines SL3. That is, the additional plane may be placed over the third signal lines SL3. Meanwhile, signal lines or a dielectric layer may be disposed at a location of the first layer, which corresponds to the fourth signal lines SL4.

As described above, in the dual-stripline structure, two adjacent layers between two reference planes may have the interrelationship. As a line width of signal lines in the second layer is determined depending to how components of the first layer are disposed, the printed circuit board 300 may have uniform impedance.

Also, like the third signal lines SL3, the crosstalk may be improved while a line width decreases. In the case where a line width decreases, a space between the third signal lines SL3 may increase, and thus, the influence between the third signal lines SL3 may be minimized. That is, the printed circuit board 300 may reduce the crosstalk without worrying about impedance mismatching.

Figure 12:
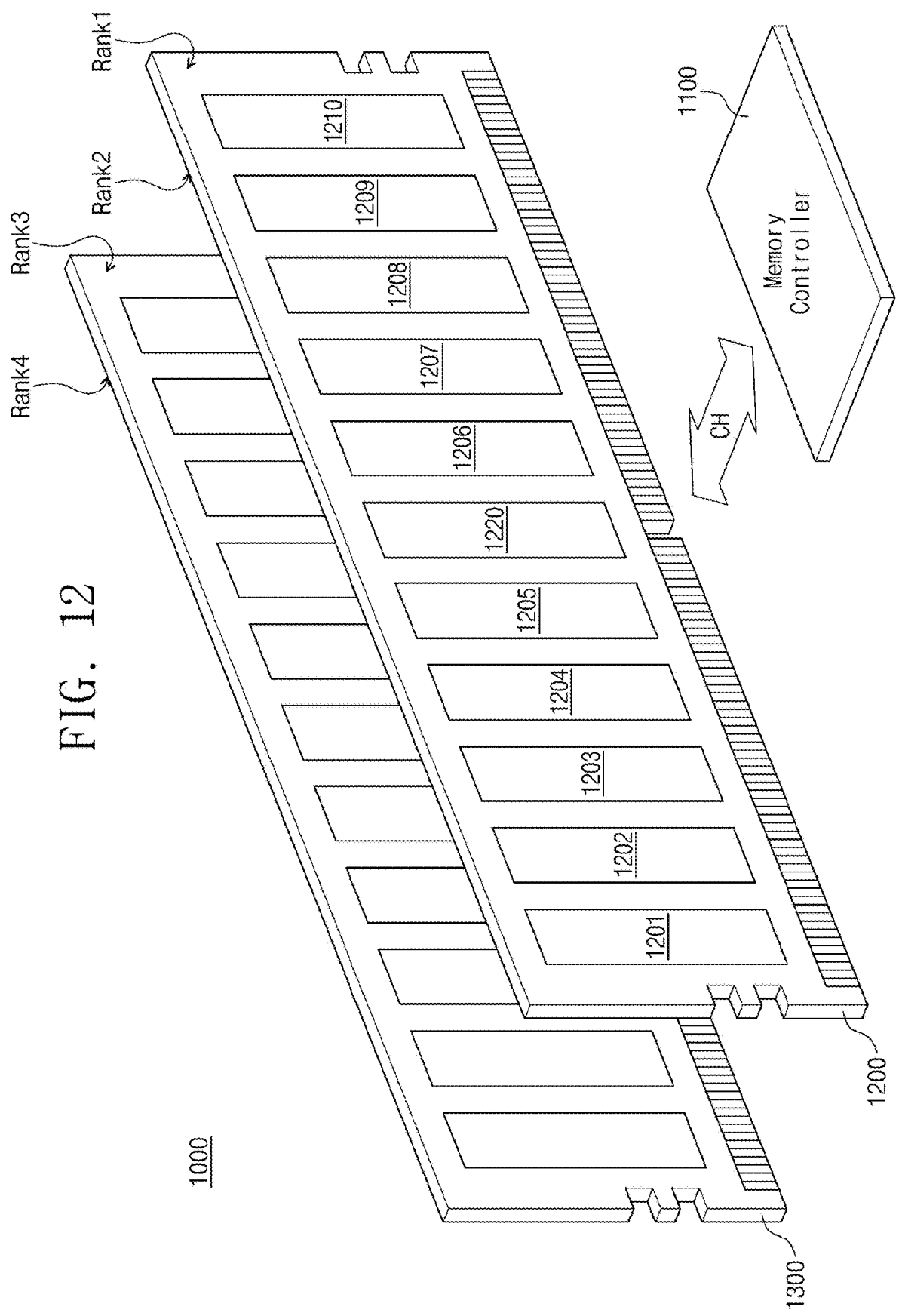
FIG. 12 is a view illustrating an example of a memory system including a memory module of FIG. 2.

FIG. 12 is a view illustrating an example of a memory system including a memory module of FIG. 2. Referring to FIGS. 1, 2, and 12, a memory system 1000 may include a memory controller 1100 and two memory modules 1200 and 1300 (i.e., 2DPC (DIMM per channel)) connected with one channel. Boards on which the memory controller 1100 and the memory modules 1200 and 1300 are disposed and sockets into which the memory modules 1200 and 1300 are inserted are not illustrated in FIG. 12, and the number of DIMMs per channel is not limited to the example of FIG. 12.

The memory controller 1100 may be the memory controller 11 of FIG. 1. The memory controller 1100 may control the memory modules 1200 and 1300 through a channel CH. Before performing data input/output with the memory modules 1200 and 1300, the memory controller 1100 may in advance set operation modes, operating environments, functions, and the like of memory chips disposed in the memory modules 1200 and 1300.

The memory controller 1100 may transmit the command and address signals CMD/ADD to the memory modules 1200 and 1300 through the channel CH. Referring to FIG. 12, for example, because one rank includes 10 memory chips and the memory modules 1200 and 1300 include four ranks, the number of memory chips may be a total of 40. The memory controller 1100 may control operations of the 40 memory chips at the same time or independently.

Each of the memory modules 1200 and 1300 may be substantially similar to the memory module 100 of FIG. 2. For example, each of the memory modules 1200 and 1300 may provide two ranks to the memory controller 1100 by using memory chips disposed on opposite surfaces thereof. Memory chips 1201 to 1210 and a register clock driver 1220 of the memory module 1200 may constitute a first rank. Second to fourth ranks may be implemented to be similar to the first rank. All the memory modules 1200 and 1300, for example, the four ranks may be provided to the memory controller 1100.

In an embodiment, clock, command, and address pins of the memory chips 1201 to 1210 of the first rank may be connected with each other or may be shared. Accordingly, the memory controller 1100 may transmit clock, command, and address signals to the clock, command, and address pins shared in a rank to control the operations of the memory chips 1201 to 1210.

Figure 13:
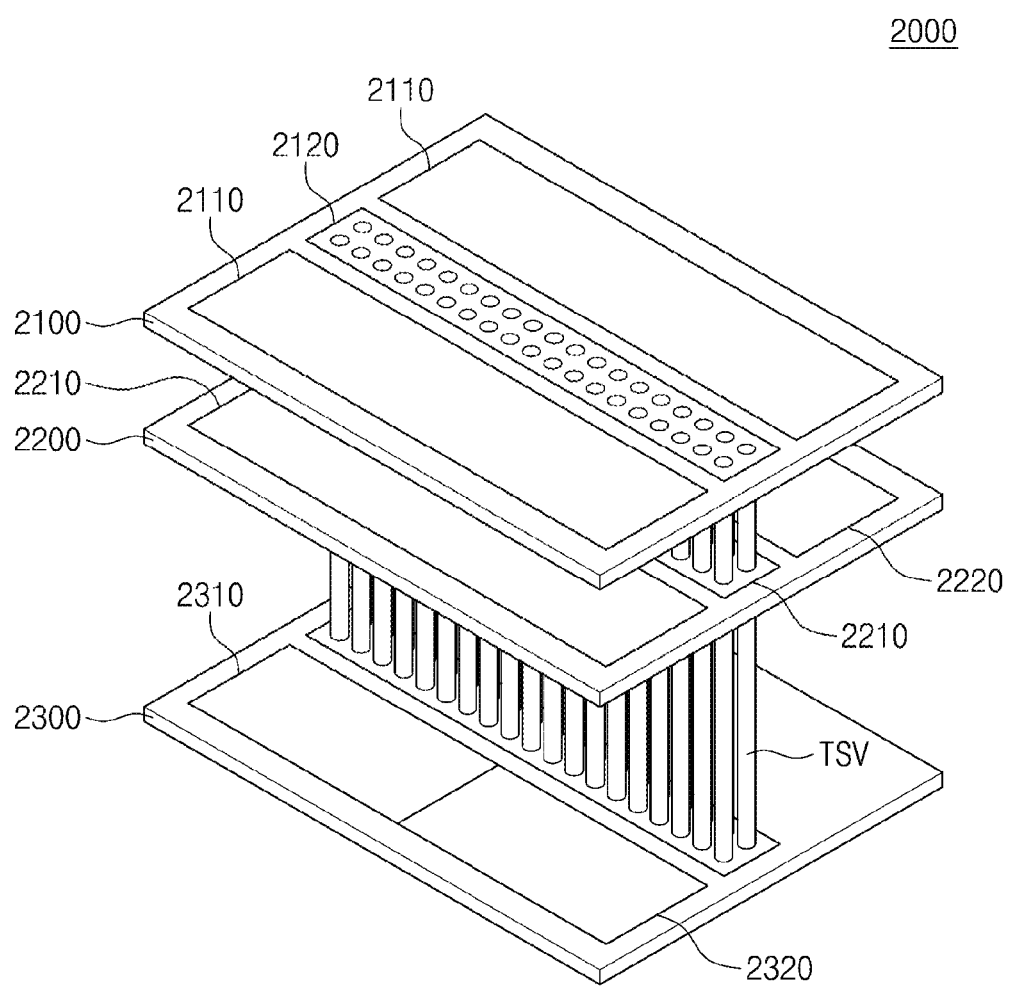
FIG. 13 is a view illustrating a memory device communicating with a memory controller of FIG. 1.

FIG. 13 is a view illustrating a memory device communicating with a memory controller of FIG. 1. A memory device 2000 may be a high bandwidth memory device, which is described above, such as HBM, HBM2, or HBM3. The memory controller 11 may communicate with the memory device 2000 instead of the memory module 12. FIG. 13 will be described together with reference to FIGS. 1 and 2. Referring to FIG. 13, the memory device 2000 may include first to third memory dies 2100 to 2300 stacked in a vertical direction and through silicon vias TSV. Herein, the number of stacked memory dies is not limited to the example illustrated in FIG. 13. For example, the first and second memory dies 2100 and 2200 may be slave dies, and the third memory die 2300 may be a master die or a buffer die.

The first memory die 2100 may include a first memory cell area 2110 and a first TSV region 2120 for an access to the first memory cell array 2110. The second memory die 2200 may include a second memory cell area 2210 and a second TSV area 2220 for an access to the second memory cell array 2210.

Herein, in the first memory die 2100, the first TSV region 2120 may refer to a region in which TSVs for communication between the first memory die 2100 and the third memory die 2300 are disposed. As in the above description, in the second memory die 2200, the second TSV region 2220 may refer to a region in which TSVs for communication between the second memory die 2200 and the third memory die 2300 are disposed. The TSVs may provide electrical paths between the first to third memory dies 2100 to 2300. The first to third memory dies 2100 to 2300 may be electrically connected to each other by the TSVs. For example, the number of through silicon vias may be several hundreds to several thousands, and the through silicon vias may be arranged in a matrix form.

The third memory die 2300 may include a first peripheral circuit 2310 and a second peripheral circuit 2320. Herein, the first peripheral circuit 2310 may include circuits for accessing the first memory die 2100, and the second peripheral circuit 2320 may include circuits for accessing the second memory die 2200. As the number of stacked memory dies increases, the number of peripheral circuits may also increase.

Figure 14:
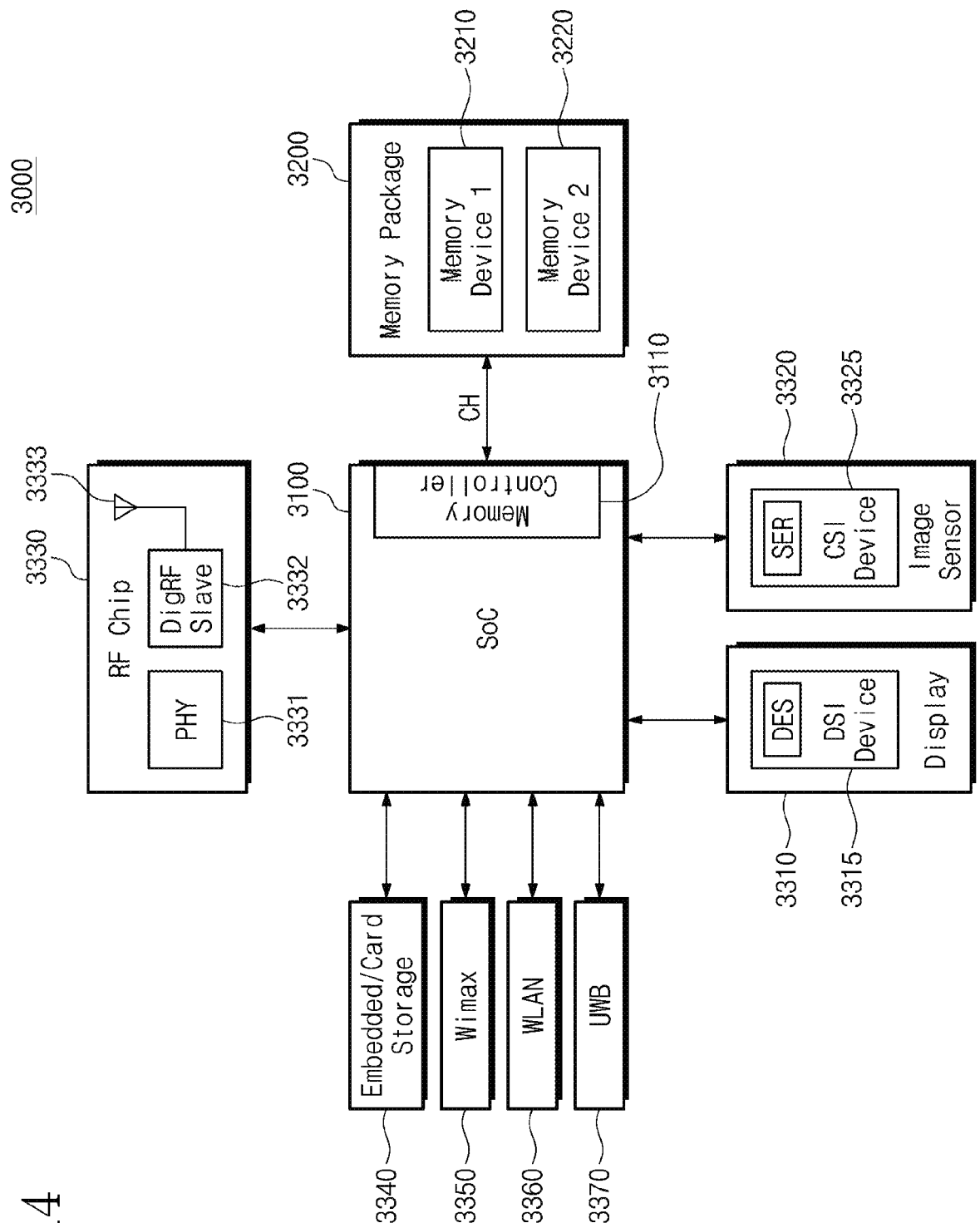
FIG. 14 is a block diagram illustrating an electronic device in which a memory system according to an embodiment of the present disclosure is implemented.

FIG. 14 is a block diagram illustrating an electronic device in which a memory system according to an embodiment of the present disclosure is implemented. An electronic device 3000 may be implemented with an electronic device that may use or support interfaces proposed by mobile industry processor interface (MIPI) alliance. For example, the electronic device 3000 may be one of a server, a computer, a smartphone, a tablet, personal digital assistant (PDA), a digital camera, a portable multimedia player (PMP), a wearable device, an Internet of Things (IoT) device, and the like, but is not limited to.

The electronic device 3000 may include a system on chip (SoC) 3100 and a memory package 3200. The SoC 3100 may include a processor for executing a program that the electronic device 3000 supports and the memory controller described with reference to FIG. 1, 2, or 12. The memory package 3200 may include a first memory device 3210 and a second memory device 3220, and each of the first memory device 3210 and the second memory device 3220 may be the memory module 100 of FIG. 2. The number of memory devices included in the memory package 3200 is not limited to the example of FIG. 14.

The electronic device 3000 may further include a display 3310 communicating with the SoC 3100. The SoC 3100 may communicate with a display serial interface (DSI) device 3315 through a DSI. For example, an optical deserializer DES may be implemented in the DSI device 3315.

The electronic device 3000 may further include an image sensor 3320 communicating in compliance with the SoC 3100. The SoC 3100 may communicate with a camera serial interface (CSI) device 3325 through a CSI. For example, an optical serializer SER may be implemented in the CSI device 3325.

The electronic device 3000 may further include a radio frequency (RF) chip 3330 that communicates with the SoC 3100. The RF chip 3330 may include a physical layer 3331, a DigRF slave 3332, and an antenna 3333. For example, the physical layer 3331 of the RF chip 3330 and the SoC 3100 may exchange data with each other through a DigRF interface proposed by the MIPI alliance.

The electronic device 3000 may further include embedded/card storage 3340. The embedded/card storage 3340 may store data provided from the SoC 3100 and may permanently store data provided from the memory package 3200. The electronic device 3000 may communicate with an external system through worldwide interoperability for microwave access (WiMAX) 3350, a wireless local area network (WLAN) 3360, ultra-wide band (UWB) 3370, and the like. In addition to the components illustrated in FIG. 14, the electronic device 3000 may further include any other components (e.g., a speaker, a microphone, and a GPS).

As a printed circuit board according to embodiments of the present disclosure includes a first layer, in which first signal lines are formed, and a second layer, in which second signal lines whose width is the same as or narrower than a width of the first signal lines, between a first reference plane and a second reference plane, impedance mismatching due to an adjacent layer may be improved, and a signal integrity characteristic may be improved. Also, the crosstalk due to the decrease in a width of a signal line may be improved.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A printed circuit board, comprising:
 a first reference plane configured to distribute a first voltage applied thereto across a surface area of the first reference plane;
 a second reference plane extending parallel to the first reference plane, and configured to distribute a second voltage applied thereto across a surface area of the second reference plane;
 a first layer, which extends between the first reference plane and the second reference plane, and includes one or more first signal lines extending adjacent the first reference plane, said first layer is divided into: (i) a first region in which the one or more first signal lines are disposed, (ii) a second region containing an additional plane that is configured to receive a third voltage and has smaller surface area relative to the surface areas of the first and second reference planes, and (iii) a third region containing a dielectric layer; and
 a second layer, which extends between the first reference plane and the second reference plane, and includes one or more second signal lines extending adjacent the second reference plane, said second signal lines having linewidths that vary as a function of whether they are vertically aligned with the first region, the second region, or the third region.

2. The printed circuit board of claim 1, wherein each of the one or more second signal lines includes at least one of a first segment that vertically overlaps the first region, a second segment that vertically overlaps the second region, and a third segment that vertically overlaps the third region.

3. The printed circuit board of claim 2, wherein a second line width of the second segment is narrower than a first line width of the first segment and a third line width of the third segment.

4. The printed circuit board of claim 3, wherein the one or more first signal lines have uniform line widths; and wherein the third line width is the same as the uniform line width of the one or more first signal lines.

5. The printed circuit board of claim 3, wherein the first line width is the same as or narrower than the third line width.

6. The printed circuit board of claim 3, wherein a length of the second segment has a difference within a specific length from a length in an extending direction of the second segment of the additional plane.

7. The printed circuit board of claim 1, wherein each of the first voltage, the second voltage, and the third voltage is a power supply voltage or a ground reference voltage.

8. The printed circuit board of claim 1, wherein the first layer and the second layer extend parallel to the first reference plane or the second reference plane.

9. The printed circuit board of claim 1, wherein the one or more first signal lines and the one or more second signal lines are configured to transfer signals provided by one or more memory chips mounted on the printed circuit board.

10. The printed circuit board of claim 1, wherein the additional plane is formed of copper (Cu).

11. A printed circuit board comprising:
 a first reference plane and a second reference plane disposed with a dielectric layer interposed therebetween and to which reference voltages are applied;
 a first layer disposed between the first reference plane and the second reference plane so as to be adjacent to the first reference plane and including a first signal line of a first line width and an additional plane configured to receive a ground voltage; and
 a second layer disposed between the first reference plane and the second reference plane so as to be adjacent to the second reference plane and including a plurality of signal lines;
 wherein an area of the additional plane is smaller than an area of each of the first reference plane and the second reference plane; and
 wherein the plurality of signal lines have different line widths depending on placement of the additional plane.

12. The printed circuit board of claim 11, wherein the plurality of signal lines include:
 a second signal line, at least a portion of which overlaps the additional plane in a vertical direction; and
 a third signal line, which does not overlap the additional plane in the vertical direction.

13. The printed circuit board of claim 12, wherein the additional plane is configured to provide a return path associated with the second signal line.

14. The printed circuit board of claim 12, wherein a second line width of the second signal line is narrower than a third line width of the third signal line.

15. The printed circuit board of claim 14, wherein the first line width is the same as the third line width.

16. A memory module comprising:
a printed circuit board including a structure in which a plurality of layers are stacked;
a plurality of memory chips disposed on one surface or opposite surfaces of the printed circuit board along one or more columns; and
a connector configured to electrically connect the memory chips with an external memory controller;
wherein the printed circuit board includes:
a first reference plane and a second reference plane disposed with a dielectric layer interposed therebetween and to which reference voltages are applied;
a first layer disposed between the first reference plane and the second reference plane so as to be adjacent to the first reference plane and including a first signal line of a first line width and an additional plane configured to receive a ground voltage; and
a second layer disposed between the first reference plane and the second reference plane so as to be adjacent to the second reference plane and including a plurality of signal lines;
wherein an area of the additional plane is smaller than an area of each of the first reference plane and the second reference plane; and
wherein the plurality of signal lines have different line widths depending on placement of the additional plane.

17. The memory module of claim 16, wherein the plurality of signal lines include:
a second signal line, at least a portion of which overlaps the additional plane in a vertical direction; and
a third signal line, which does not overlap the additional plane in the vertical direction.

18. The memory module of claim 17, wherein a second line width of the second signal line is narrower than a third line width of the third signal line.

19. The memory module of claim 16, wherein the first signal line and the plurality of signal lines are connected with at least one of the plurality of memory chips to transfer signals.

20. The memory module of claim 16, further comprising:
a register clock driver configured to receive a command signal from the memory controller and to control the plurality of memory chips based on the command signal; and
wherein the plurality of memory chips are separated and disposed on left and right sides of the register clock driver.

* * * * *